US008105944B2

(12) United States Patent
Arikawa (10) Patent No.: US 8,105,944 B2
(45) Date of Patent: Jan. 31, 2012

(54) METHOD OF DESIGNING SEMICONDUCTOR DEVICE AND METHOD OF MANUFACTURING THE SAME

(75) Inventor: Naoshi Arikawa, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 12/835,391

(22) Filed: Jul. 13, 2010

(65) Prior Publication Data

US 2011/0039409 A1 Feb. 17, 2011

(30) Foreign Application Priority Data

Aug. 12, 2009 (JP) .................................. 2009-187499

(51) Int. Cl.
*H01L 21/44* (2006.01)
(52) U.S. Cl. ................................. 438/667; 257/E21.577
(58) Field of Classification Search .................. 438/667; 257/E21.577
See application file for complete search history.

(56) References Cited

U.S. PATENT DOCUMENTS

| 6,342,734 B1* | 1/2002 | Allman et al. ................. 257/758 |
| 7,518,243 B2 | 4/2009 | Tokumine |
| 2005/0194679 A1* | 9/2005 | Tokumine ..................... 257/734 |
| 2007/0161211 A1* | 7/2007 | Sunohara et al. ............. 438/455 |

FOREIGN PATENT DOCUMENTS

JP 2005-252027 A 9/2005
* cited by examiner

*Primary Examiner* — Alexander Ghyka
*Assistant Examiner* — Stanetta Isaac
(74) *Attorney, Agent, or Firm* — Foley & Lardner LLP (57) ABSTRACT

A semiconductor device includes a capacitor including a lower electrode and a upper electrode, and a capacitive film formed therebetween; a first via group including one or more first vias which is electrically connected to the lower electrode; and a second via group including one or more second vias which is electrically connected to the upper electrode and formed simultaneously with the first via group. The semiconductor device is designed by a method including a step of setting the number of the first vias and the second vias so that a value obtained by dividing a capacitance value of the capacitor by the total number of the first vias and the second vias included in the first via group and the second via group is set to be equal to or less than a predetermined value.

8 Claims, 6 Drawing Sheets

METHOD OF DESIGNING SEMICONDUCTOR DEVICE AND METHOD OF MANUFACTURING THE SAME

The application is based on Japanese patent application NO. 2009-187499, the content of which is incorporated hereinto by reference.

BACKGROUND

1. Technical Field

The present invention relates to a method of designing a semiconductor device and a method of manufacturing the semiconductor device.

2. Related Art

A via which is connected to an interconnect is required to have electrically low resistance. However, in the related art, there has been a problem that a high-resistivity layer is formed in the via which is electrically connected to a polysilicon-insulator-polysilicon (PIP) capacitor or a metal-insulator-metal (MIM) capacitor configured using polysilicon or metal as an electrode and using an insulating film such as an oxide film or a nitride film as a capacitive film, to thereby cause the conduction failure. However, it is difficult to detect the conduction failure in an inspection after the via formation due to the high resistance of the via. For this reason, it is necessary to design the semiconductor device so that conduction failure of the via is not generated from the beginning.

Japanese Unexamined patent publication NO. 2005-252027 discloses a semiconductor device having a multilayer interconnect structure including a semiconductor substrate; a plurality of metal interconnects provided on the semiconductor substrate and electrically isolated from the upper and lower metal interconnects by an insulating interlayer; and, at least one via passing through the insulating interlayer and connecting a metal interconnect of a first layer and a metal interconnect of a second layer positioned at an upper layer of the metal interconnect of the first layer, wherein potential of a predetermined interconnect of the metal interconnect of the first layer is electrically floated from the semiconductor substrate, and a capacitance value between the metal interconnect of the first layer and the semiconductor substrate per one via provided on the predetermined interconnect of the metal interconnect of the first layer is a predetermined value or less.

However, in the configuration of the related art, there has been a problem that a large number of vias are required, and the chip size becomes large. The inventor has found the configuration of the invention as a result of conducting various studies by taking into consideration that the high-resistivity layer is formed due to the influences such as charges or moisture in a process at the time of opening a via hole, in order to form the via to be electrically connected to the capacitor.

SUMMARY

In one embodiment, there is provided a method of designing a semiconductor device which includes: a capacitor including a first electrode and a second electrode formed over a substrate, and a capacitive film formed between the first electrode and second electrode; a first via group including one or more first vias which is formed over the substrate, electrically connected to the first electrode, and formed simultaneously with each other; and a second via group including one or more second vias which is formed over the substrate, electrically connected to the second electrode, and formed simultaneously with the first via group. The method includes setting the number of the first vias and the second vias so that a value obtained by dividing a capacitance value of the capacitor by the total number of the first vias and the second vias included in the first via group and the second via group is set to be equal to or less than a predetermined value.

Further, in another embodiment, there is provided a method of manufacturing the semiconductor device designed by the method of designing the above-mentioned semiconductor device. The method includes simultaneously forming via holes for forming vias which are constituted by the first via group and the second via group.

The inventor has found that when the vias which are electrically connected to the first electrode and the second electrode of the capacitor, respectively, exist and the number of vias satisfies the following Expression 1, it is possible to prevent the high-resistance failure or the opening failure of the vias, and to prevent an increase in the number of excess vias. Here, the number of vias electrically connected to the first electrode of the capacitor is set to Na, and the number of vias electrically connected to the second electrode thereof is set to Nb. In addition, C is a capacitance value of the capacitor, and $C_{ref}$ is a predetermined value. Here, the predetermined value $C_{ref}$ can be set to a capacitance value of the range in which the high-resistance failure of the via is not generated. The predetermined value $C_{ref}$ can be set to, for example, 8 pF.

$$Na+Nb \geqq C/C_{ref} \qquad \text{Expression (1)}$$

(where Na and Nb are equal to or larger than 1, respectively (in the case of being configured as a circuit))

Hereby, compared to the configuration of the related art disclosed in Japanese Unexamined Patent Publication No. 2005-252027, it is possible to reduce the required number of vias, and to prevent the high-resistance failure and the opening failure of the via from being generated while reducing a layout area of the element or the interconnect. In addition, it is also possible to improve the degree of freedom of layout.

Moreover, arbitrary combinations of the above-mentioned components, and ones obtained by conversion of the expression of the invention among methods, devices and the like are also valid as aspects of the invention.

According to the invention, it is possible to prevent the high-resistance failure and the opening failure of the via from being generated while reducing a layout area of the element or the interconnect.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, the embodiment of the invention will be described with reference to the accompanying drawings. In all the drawings, like elements are referenced by like reference numerals and descriptions thereof will not be repeated.

First Embodiment

Figure 1:
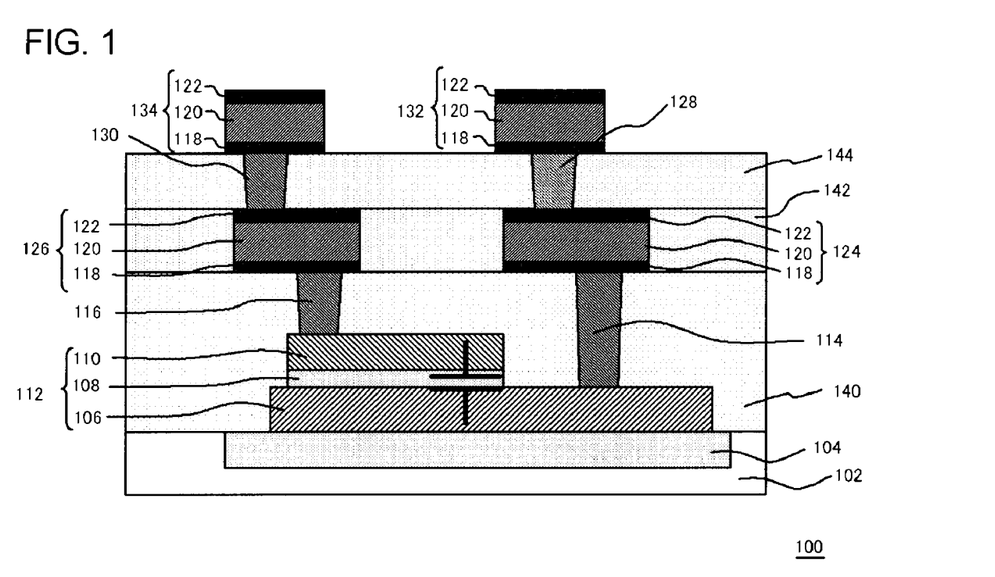
FIG. 1 is a cross-sectional view illustrating the basic configuration of a semiconductor device to be designed and manufactured by a design method in an embodiment of the invention.

FIG. 1 is a cross-sectional view illustrating the basic configuration of a semiconductor device to be designed and manufactured by a design method in the embodiment.

A semiconductor device 100 includes a capacitor 112 including a lower electrode 106 (first electrode), an upper electrode 110 (second electrode), and a capacitive film 108 formed therebetween, a first via group including one or more vias 128 (first via) which is electrically connected to the lower electrode 106, and a second via group including one or more vias 130 (second via) which is electrically connected to the upper electrode 110 and is formed simultaneously with the first via group. In the embodiment, the semiconductor device 100 is designed by the design method including a step of setting the number of vias so that a value obtained by dividing a capacitance value of the capacitor 112 by the total number of vias included in the first via group and the second via group is set to be equal to or less than a predetermined value.

The semiconductor device 100 includes a semiconductor substrate 102 such as a silicon substrate, an insulating film 104 formed in the surface of the semiconductor substrate 102, and an insulating interlayer 140, an insulating interlayer 142 and an insulating interlayer 144 formed on the insulating film 104 in this order. The capacitor 112 stacked in order of the lower electrode 106, the capacitive film 108 and the upper electrode 110, a via 114 connected to the lower electrode 106 of the capacitor 112, and a via 116 connected to the upper electrode 110 of the capacitor 112 are formed within the insulating interlayer 140 on the insulating film 104. The capacitor 112 is insulated from the semiconductor substrate 102, and is electrically floated.

An interconnect 124 connected to the via 114 and an interconnect 126 connected to the via 116 are formed within the insulating interlayer 142. The via 128 (first via) connected to the interconnect 124 and the via 130 (second via) connected to the interconnect 126 are formed within the insulating interlayer 144. Further, another insulating interlayer (not shown) is formed on the insulating interlayer 144, and an interconnect 132 connected to the via 128 and an interconnect 134 connected to the via 130 are formed within the aforementioned insulating interlayer.

Here, the capacitor 112 can be a PIP capacitor in which the lower electrode 106 and the upper electrode 110 are respectively made of polysilicon. The capacitive film 108 can be made of a high-dielectric constant material such as, for example, $SiO_2$, $Ta_2O_5$, $Al_2O_3$, $ZrO_x$, $HfO_x$, or $HfSiO_x$. The capacitive film 108 can be formed by, for example, a CVD method or an atomic layer deposition (ALD) method and the like.

The insulating film 104 can be made of, for example, $SiO_2$. The insulating interlayer 140, the insulating interlayer 142 and the insulating interlayer 144 can be made of, for example, $SiO_2$ or SiOF. The via 114, the via 116, the via 128, and the via 130 can be made of, for example, tungsten and the like.

The interconnect 124, the interconnect 126, the interconnect 132, and the interconnect 134, respectively, have a configuration in which a lower barrier metal film 118, an interconnect film 120 and an upper barrier metal film 122 are stacked in this order. The lower barrier metal film 118 and the upper barrier metal film 122 can be respectively made of, for example, Ti, TiN, and a stacked film thereof. The lower barrier metal film 118 and the upper barrier metal film 122 can also be a stacked film in which, for example, Ti and TiN are stacked in this order.

Figure 2A:
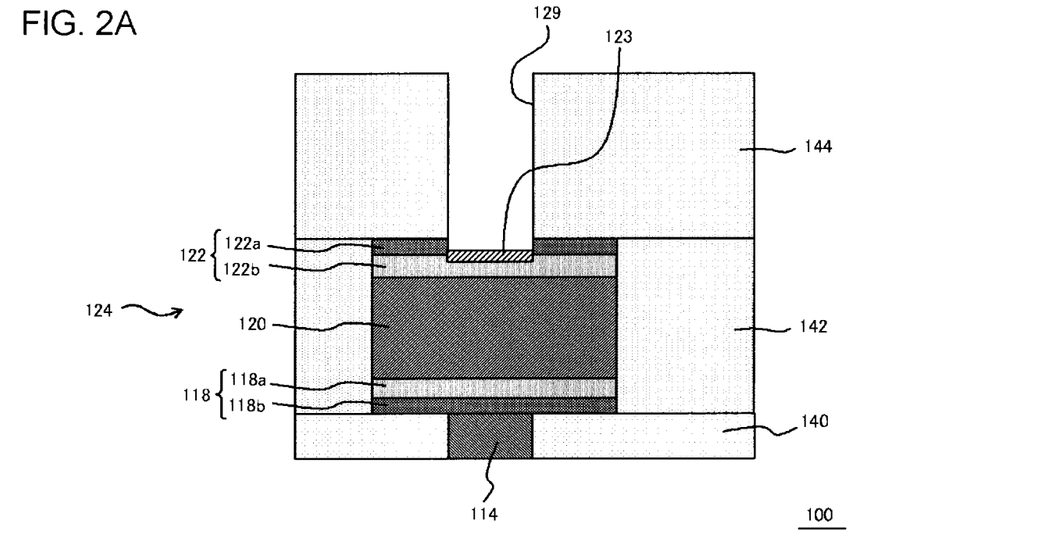
FIGS. 2A and 2B are process cross-sectional views illustrating an enlarged interconnect of the semiconductor device shown in FIG. 1.
Figure 2B:
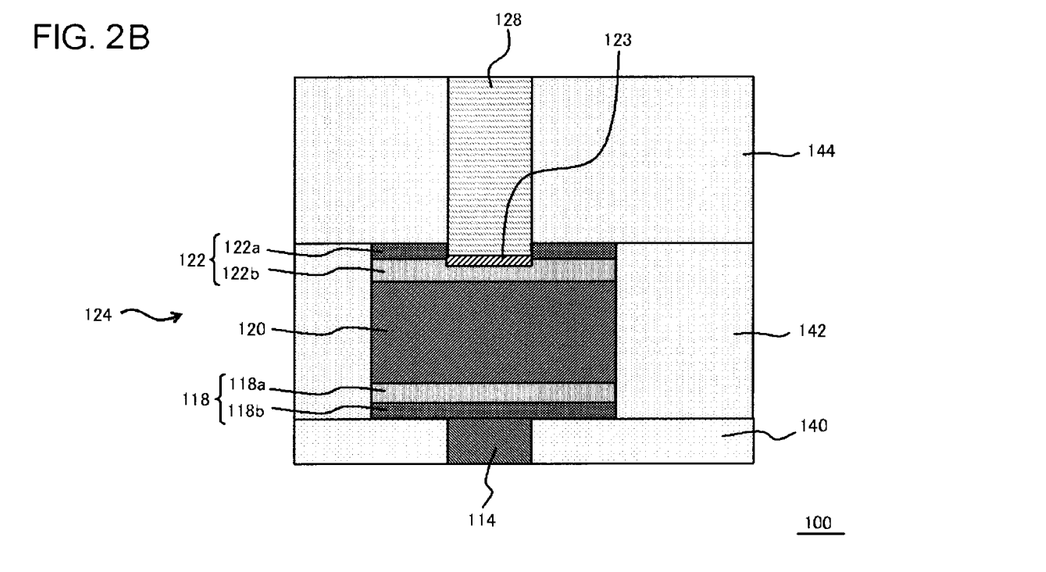

FIGS. 2A and 2B are process cross-sectional views illustrating the enlarged interconnect 124 of the semiconductor device 100.

Here, an example is shown in which the lower barrier metal film 118 and the upper barrier metal film 122 are made of a stacked film of a TiN film 118b and a Ti film 118a and a stacked film of a Ti film 122b and a TiN film 122a, respectively.

At the time of forming the via 128, a via hole 129 for exposing the upper surface of the upper barrier metal film 122 is first formed in the insulating interlayer 142. Here, as shown in FIG. 1, the via 114 is connected to the lower electrode 106 of the capacitor 112. Positive charges are accumulated in the capacitor 112 having a high capacity by plasma and the like in an etching process or a film-forming process. For this reason, the positive charges are easily accumulated even in the interconnect 124 connected to the capacitor 112. At the time of forming the via hole 129 in the insulating interlayer 142, when the upper surface of the upper barrier metal film 122 is exposed and the TiN film 122a or the Ti film 122b of the upper barrier metal film 122 located at the bottom face of the via hole 129 is exposed to moisture due to wet processing or neglect in line or long-term storage and the like, the positive charges absorb water, and thus a hydroxide is formed by the reaction of the upper barrier metal film 122 and water. Next, the volume is contracted in the course of dehydration, and an oxide (insulating film) is formed and thus a high-resistivity layer 123 is easily formed on the surface of the upper barrier metal film 122 (FIG. 2A). In addition, the remaining fluorine gas and the like included in an etching gas at the time of opening also acts as a factor for the acceleration of the oxide formation.

When such a high-resistivity layer 123 is formed on the surface of the upper barrier metal film 122, and a metal is buried within the via hole 129 to form the via 128 (FIG. 2B), the conduction failure between the interconnect (not shown) formed on the upper layer of the via 128 and the interconnect 124 occurs.

The inventor has found that if the total number of vias on the interconnect 124 and the interconnect 126 connected respectively to the lower electrode 106 and the upper electrode 110 of the capacitor 112 satisfies the following Expression (1), it is possible to prevent the high-resistance failure or the opening failure of the vias, and to prevent an increase in the number of excess vias. Here, the number of vias (the first vias included in the first via group) on the interconnect 126 connected to the lower electrode 106 of the capacitor 112 is set to Na, and the number of vias (the second vias included in the second via group) on the interconnect 124 connected to the upper electrode 110 thereof is set to Nb. In addition, C is a capacitance value of the capacitor 112, and $C_{ref}$ is a predetermined value. In the embodiment, the predetermined value $C_{ref}$ can be set to, for example, 8 pF. Meanwhile, when the distance between the interconnect 124 and the interconnect 126 is near, and a value of the capacitor which is formed therebetween is not negligible, C in the following Expression (1) can be set so that it includes even a capacitance value of the capacitor which is formed between the interconnect 124 and the interconnect 126, in addition to a capacitance value of the capacitor 112.

$$Na+Nb \geq C/C_{ref} \qquad \text{Expression (1)}$$

(where Na and Nb are equal to or larger than 1, respectively (in the case of being configured as a circuit))

In the method of designing the semiconductor device 100 of the embodiment, in order for the high-resistivity layer 123 not to be formed, the number of vias which are electrically connected to the lower electrode 106 or the upper electrode 110 of one capacitor 112 and are simultaneously formed is set to satisfy the above expression. Hereby, it is possible to prevent the high-resistance failure and the opening failure of the via from being generated while reducing a layout area of the element or the interconnect. In addition, it is also possible to improve the degree of freedom of the layout further than in the related art.

For example, when the predetermined value $C_{ref}$ is 8 pF, and the capacitance value of the capacitor 112 is 24 pF, Na+Nb may be set to be equal to or more than 3. For this reason, in order to minimize the number of vias, it is possible to set the number of vias 128 to be formed on the interconnect 124 to two and set the number of vias 130 to be formed on the interconnect 126 to one, or it is possible to set the number of vias 128 to be formed on the interconnect 124 to one and set the number of vias 130 to be formed on the interconnect 126 to two.

Figure 3A:
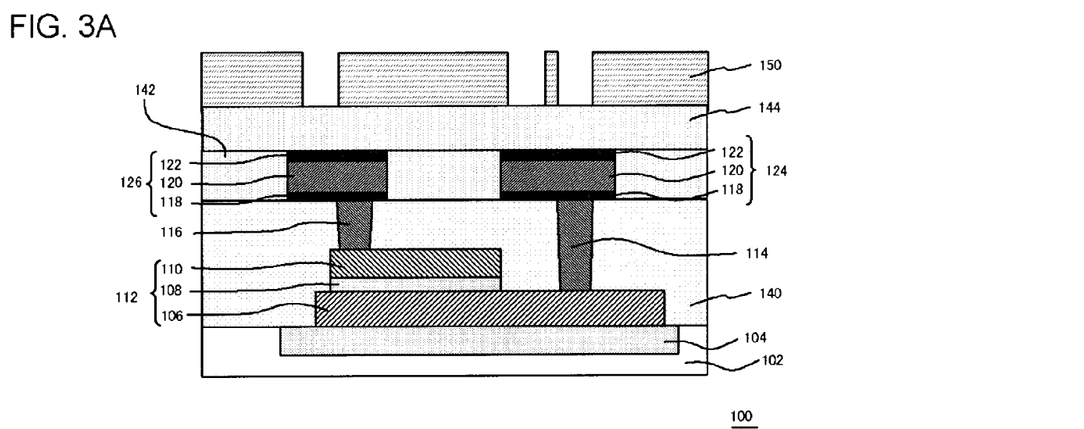
FIGS. 3A and 3B are process cross-sectional views illustrating a procedure in which vias are formed in the embodiment of the invention.
Figure 3B:
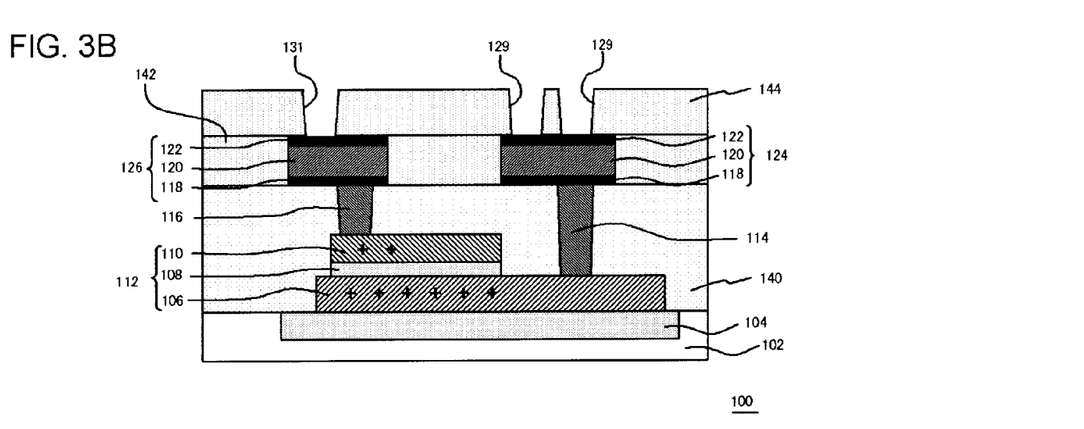
Figure 4:
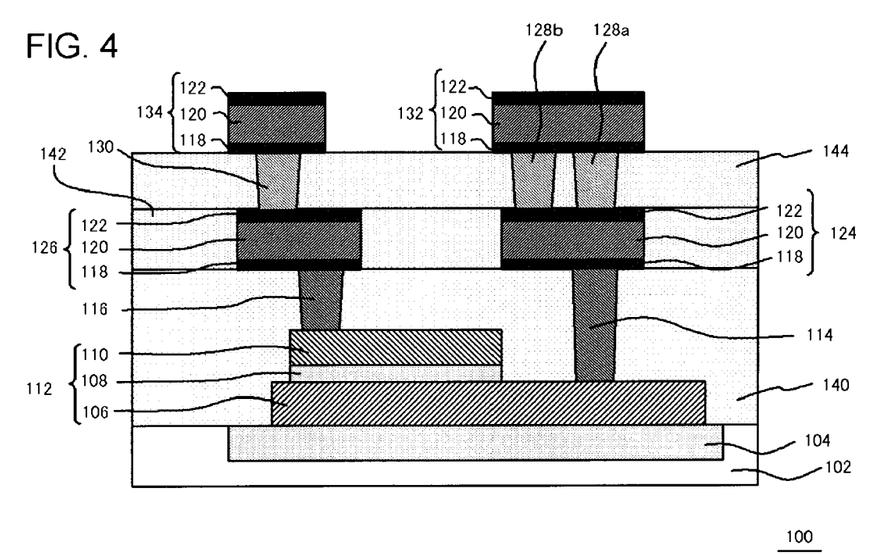
FIG. 4 is a process cross-sectional view illustrating a procedure in which the vias are formed in the embodiment of the invention.

FIGS. 3A, 3B and 4 are process cross-sectional views illustrating procedures in which the via 128 and the via 130 are formed in the embodiment.

After the interconnect 124 and the interconnect 126 are formed within the insulating interlayer 142, the insulating interlayer 144 is formed on the insulating interlayer 142. Subsequently, a resist film 150 having an opening for forming a via hole is formed on the insulating interlayer 142 (FIG. 3A). Here, a case where two vias are formed on the interconnect 124, and one via is formed on the interconnect 126 is shown as an example.

Next, the insulating interlayer 142 is etched using the resist film 150 as a mask, and the via hole 129 and a via hole 131 are formed on the insulating interlayer 142 (FIG. 3B). The via hole 129 and the via hole 131 are formed so as to reach the upper surfaces of the interconnect 124 and the interconnect 126, respectively. Here, the via hole 129 and the via hole 131 are etched so that the barrier metal films 122 of the interconnect 124 and the interconnect 126 are simultaneously exposed to the bottoms thereof by controlling the etching conditions.

At this time, when the upper surfaces of the interconnect 124 and the interconnect 126 are exposed by forming the via hole 129 and the via hole 131, the positive charges are generated on the surfaces of the interconnect 124 and the interconnect 126. Here, since two via holes 129 are formed on the interconnect 124, such positive charges can be scattered to per one via hole 129. Hereby, it is possible to prevent the upper barrier metal film 122 from being oxidized in the bottom face of each via hole 129 due to an influence of the positive charges, and to prevent a high-resistance component from being generated.

On the other hand, since a great number of via holes are formed on the interconnect 124 compared to the interconnect 126, more positive charges flow into the lower electrode 106 of the capacitor 112. For this reason, the negative charges are attracted to the upper electrode 110, and as a result the amount of positive charges at the upper electrode 110 side can be relatively reduced. Hereby, it is possible to prevent the upper barrier metal film 122 from being oxidized in the bottom face of the via hole 131 due to an influence of the positive charges, and to prevent a high-resistance component from being generated.

In this manner, the number of vias to be electrically connected to one capacitor 112 can be determined in consideration of the total number of via holes to be simultaneously formed, and interconnects or the like to be substantially simultaneously exposed which are connected to any of the lower electrode 106 or the upper electrode 110 of the capacitor 112.

Meanwhile, on the contrary to the above, one via can be formed on the interconnect 124, and two vias can be formed on the interconnect 126.

Figure 5:
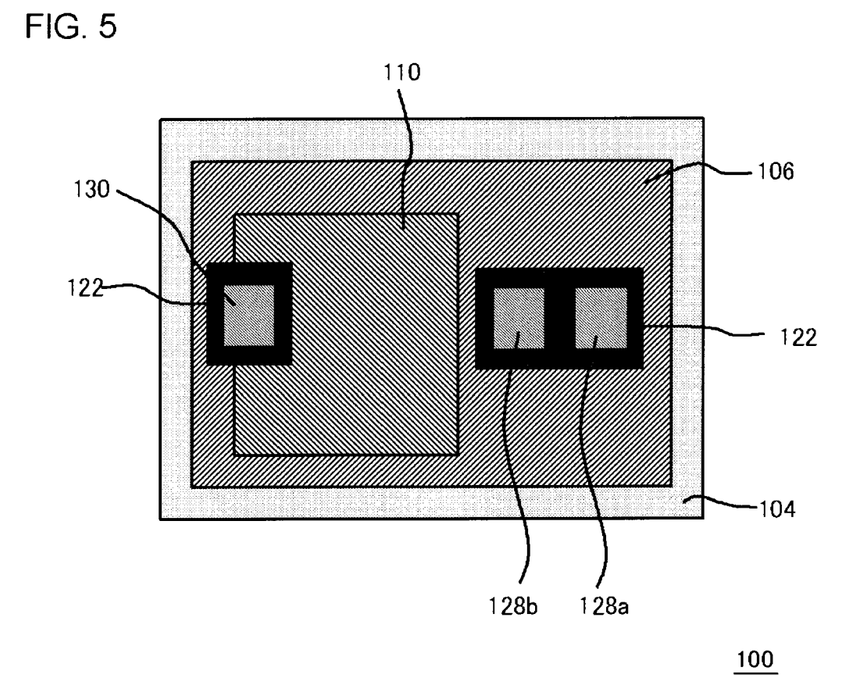
FIG. 5 is a top view illustrating the configuration of the semiconductor device shown in FIG. 4.

After this, a via 128a, a via 128b, and the via 130 are formed by burying a conductive material such as tungsten within the via hole 129 and the via hole 131. Subsequently, an insulating interlayer (not shown) is formed on the insulating interlayer 144, and the interconnect 132 and the interconnect 134 are formed within the insulating interlayer 144. Hereby, the semiconductor device 100 having a configuration shown in FIG. 4 is obtained. FIG. 5 is a top view of the semiconductor device 100 shown in FIG. 4. Here, the interconnect 134, the interconnect 132, the insulating interlayer 144, the insulating interlayer 142, and the insulating interlayer 140 are omitted for the purpose of easy understanding. Meanwhile, although not shown in the drawing, even when the vias are formed on the interconnect 132 and the interconnect 134, the number of vias can be set in the same way as setting the number of via 128a, via 128b, and via 130.

Next, the advantages of the method of designing the semiconductor device 100 according to the embodiment and the method of manufacturing the same will be described.

Figure 6:
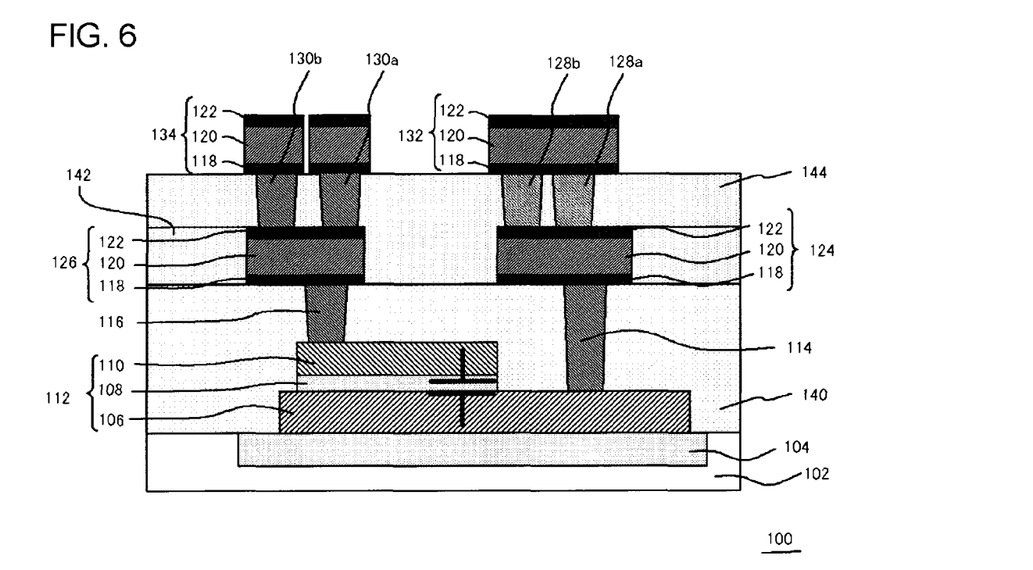
FIG. 6 is a cross-sectional view illustrating the configuration in which each of two vias is provided on two interconnects.
Figure 7:
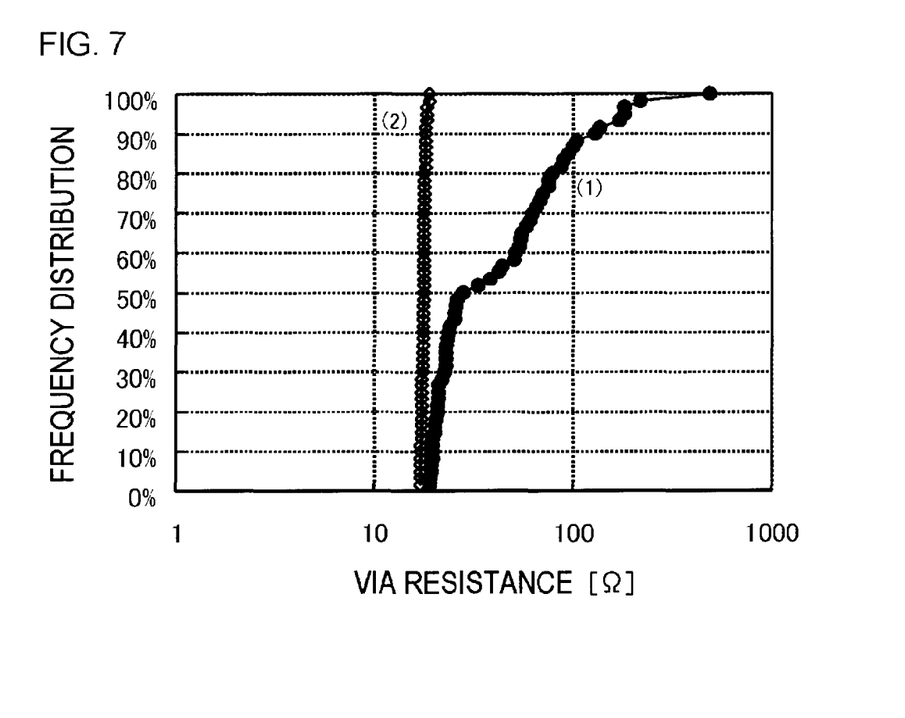
FIG. 7 is a diagram illustrating a relationship between resistance and frequency distribution.

As shown in FIG. 6, two vias (via 130a and via 130b) were provided on the interconnect 126, two or four vias (only two of the via 128a and the via 128b are displayed) were provided on the interconnect 124, and resistances (via resistances (Ω)) between the via 130a and the interconnect 126 and the via 130b at the upper electrode 110 side were measured. A relationship between resistance and frequency distribution is shown in FIG. 7. When (1) in FIG. 7 shows a case where two vias are provided on the interconnect 124, (2) shows the result of a case where four vias are provided on the interconnect 124. In (2) where four vias are provided on the interconnect 124, the via resistances between the via 130a and the interconnect 126 and the via 130b at the upper electrode 110 side are maintained low compared to (1) where two vias are provided on the interconnect 124.

From this result, it has been found that even in the state where the number of vias at the interconnect 126 side electrically connected to the upper electrode 110 of the capacitor 112 is fixed, it is possible to prevent the high-resistance component from being formed in the via at the interconnect 126 side and to prevent the resistance from being heightened, by increasing the number of vias at the interconnect 124 side electrically connected to the lower electrode 106 which is an opposite electrode of the upper electrode 110 of the same capacitor 112. In other words, it is possible to prevent the high-resistance component from being generated by setting the sum total of the number of vias on the interconnects to be electrically connected respectively to the lower electrode 106 and the upper electrode 110 of the capacitor 112, without individually increasing the number of vias on the interconnects to be electrically connected respectively to the lower electrode 106 and the upper electrode 110 of the capacitor 112. Hereby, it is possible to improve the degree of freedom of layout and to reduce the chip size. Hereby, it is possible to improve a yield ratio of the via and secure qualities thereof, and to prevent the number of excess vias from being increased.

Second Embodiment

Figure 8:
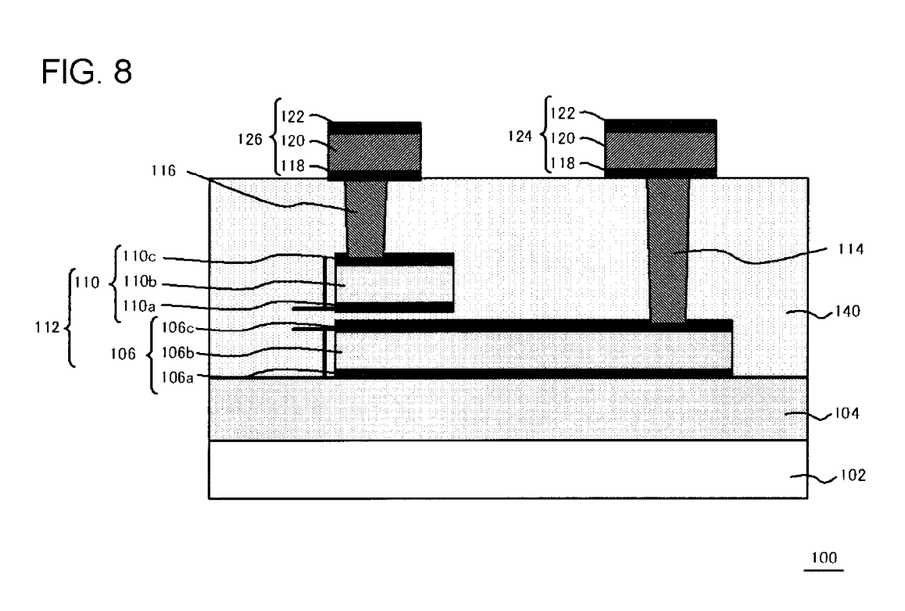
FIG. 8 is a cross-sectional view illustrating the configuration of the semiconductor device to be designed and manufactured by the design method in the embodiment of the invention.

FIG. 8 is a cross-sectional view illustrating the configuration of the semiconductor device 100 according to the embodiment.

The embodiment is different from the first embodiment in that the lower electrode 106 and the upper electrode 110 of the capacitor 112 include a barrier metal film 106a, an interconnect film 106b and a barrier metal film 106c, and a barrier metal film 110a, an interconnect film 110b and a barrier metal film 110c, respectively. Here, the insulating interlayer 140 functions as a capacitive film.

In such a case, when the via 114 or the via 116 is formed, the high-resistivity layer is easily formed on the superficial layers of the barrier metal film 110c or the barrier metal film 106c of the via bottoms. In the embodiment, the total number of vias 116 and vias 114, which are vias electrically connected to the lower electrode 106 or the upper electrode 110 of the capacitor 112 and are simultaneously formed, is set to satisfy Expression (1) described in the first embodiment. Here, the via holes (not shown) for forming the via 116 and the via 114 respectively are etched so that the barrier metal film 110c or the barrier metal film 106c are simultaneously exposed to the bottoms thereof, by controlling the etching conditions. Hereby, it is possible to make arrangements so that the high-resistance failure and the opening failure of the via do not occur while reducing a layout area of the element or the interconnect. In addition, it is also possible to improve the degree of freedom of the layout further than in the related art.

Third Embodiment

Figure 9:
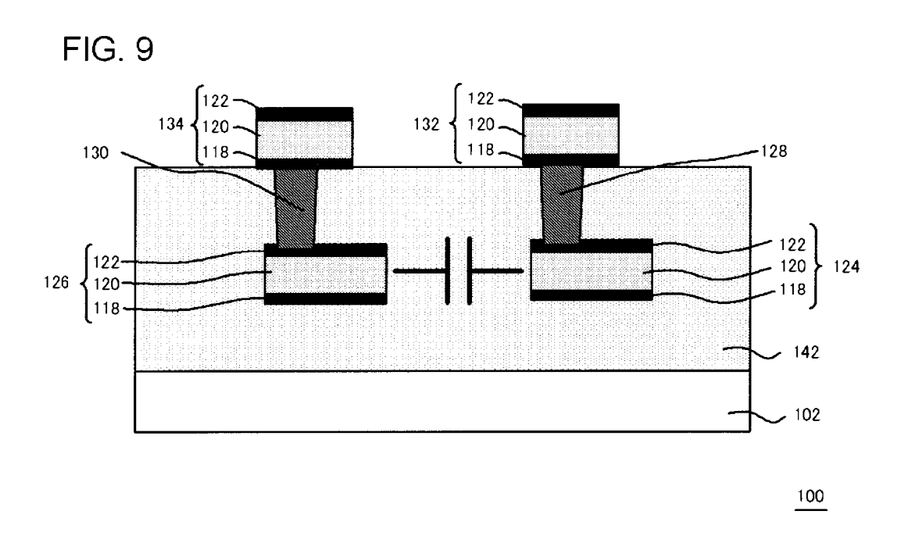
FIG. 9 is a cross-sectional view illustrating the configuration of the semiconductor device to be designed and manufactured by the design method in the embodiment of the invention.

FIG. 9 is a cross-sectional view illustrating the configuration of the semiconductor device 100 according to the embodiment.

The embodiment is different from the first and second embodiments in that a capacitor is formed between the interconnect 124 and the interconnect 126. When the interconnect 124 and the interconnect 126 are electrically floated from the semiconductor substrate 102, a capacitor is formed between the interconnect 124 and the interconnect 126.

In the case of such a structure, when the via 128 or the via 130 is formed similarly to the first embodiment, the high-resistivity layer is easily formed on the superficial layer of the upper barrier metal film 122 which is exposed to the via hole bottom. In the embodiment, the total number of vias 128 and vias 130, which are vias electrically connected to the interconnect 124 or the interconnect 126 and simultaneously formed, is set to satisfy Expression (1) described in the first embodiment. Hereby, it is possible to make arrangements so that the high-resistance failure and the opening failure of the via do not occur while reducing a layout area of the element or the interconnect. In addition, it is also possible to improve the degree of freedom of the layout further than in the related art.

As described above, although the embodiments of the invention have been set forth with reference to the drawings, they are merely illustrative of the invention, and various configurations other than those stated above can be adopted.

In the aforementioned embodiments, a case where the capacitor 112 is a PIP capacitor in which the lower electrode 106 and the upper electrode 110 are respectively made of polysilicon has been described as an example. However, the capacitor 112 can be a metal-insulator-metal (MIM) capacitive element in which both the lower electrode 106 and the upper electrode 110 are made of a metal, or can be a capacitive element having a metal-insulator-polysilicon (MIP) structure in which one of the lower electrode 106 and the upper electrode 110 is made of a metal, and the other thereof is made of polysilicon.

It is apparent that the present invention is not limited to the above embodiment, but may be modified and changed without departing from the scope and spirit of the invention.

What is claimed is:

1. A method of designing a semiconductor device which includes:
   a capacitor including a first electrode and a second electrode formed over a substrate, and a capacitive film formed between said first electrode and said second electrode;
   a first via group including one or more first vias which is formed over said substrate, electrically connected to said first electrode, and formed simultaneously with each other; and
   a second via group including one or more second vias which is formed over said substrate, electrically connected to said second electrode, and formed simultaneously with said first via group,
   said method comprising:
   setting the number of said first vias and said second vias so that a value obtained by dividing a capacitance value of said capacitor by the total number of said first vias and said second vias included in said first via group and said second via group is set to be equal to or less than a predetermined value.

2. The method of designing the semiconductor device as set forth in claim 1,
   wherein said predetermined value is a capacitance value of the range in which high-resistance failure of the via is not generated.

3. The method of designing the semiconductor device as set forth in claim 1,
   wherein said predetei mined value is 8 pF.

4. The method of designing the semiconductor device as set forth in claim 1,
   wherein said step of setting the number of said first vias and said second vias is performed when a barrier metal film exists directly below said first via group or said second via group.

5. The method of designing the semiconductor device as set forth in claim 4,
   wherein said barrier metal film is made of a Ti film, a TiN film, or a stacked fil thereof.

6. The method of designing the semiconductor device as set forth in claim 1, wherein said capacitor is constituted by a lower electrode, a capacitive film, and an upper electrode stacked in this order.

7. The method of designing the semiconductor device as set forth in claim 1, wherein said capacitor is constituted by a first interconnect and a second interconnect formed in the same layer, and an insulating film disposed between the first interconnect and the second interconnect.

8. A method of manufacturing the semiconductor device designed by the method of designing the semiconductor device as set forth in claim 1, said method of manufacturing comprising:

simultaneously forming via holes for forming vias which are constituted by said first via group and said second via group.

* * * * *